United States Patent [19]

Hill

[11] Patent Number: 6,031,428
[45] Date of Patent: *Feb. 29, 2000

[54] STEERED FREQUENCY PHASE LOCKED LOOP

[75] Inventor: Martin Hill, Bentley, Australia

[73] Assignee: Curtin University of Technology, Bentley, Australia

[*] Notice: This patent issued on a continued prosecution application filed under 37 CFR 1.53(d), and is subject to the twenty year patent term provisions of 35 U.S.C. 154(a)(2).

[21] Appl. No.: 08/849,766

[22] PCT Filed: Nov. 28, 1995

[86] PCT No.: PCT/AU95/00793

§ 371 Date: Sep. 30, 1997

§ 102(e) Date: Sep. 30, 1997

[87] PCT Pub. No.: WO96/17435

PCT Pub. Date: Jun. 6, 1996

[30] Foreign Application Priority Data

Nov. 28, 1994 [AU] Australia ................................. PM9725

[51] Int. Cl.[7] ............................ H03L 7/07; H03L 7/087; H03D 1/00; H03D 3/00
[52] U.S. Cl. ................................. 331/11; 331/2; 331/16; 331/17; 331/23; 331/25; 327/156; 375/376; 455/260; 329/302; 329/307; 329/325; 329/360
[58] Field of Search ............................ 331/10–12, 16–18, 331/25, 23, 2; 327/156–159; 375/376; 455/260; 329/325, 360, 302, 307–309

[56] References Cited

U.S. PATENT DOCUMENTS

| | | | |
|---|---|---|---|
| 3,458,823 | 7/1969 | Nordahl | 327/41 |
| 4,388,596 | 6/1983 | Yamashita | 331/1 A |
| 4,500,851 | 2/1985 | Sawa et al. | 331/2 |
| 4,514,705 | 4/1985 | Harzer | 331/2 |
| 4,542,351 | 9/1985 | Okada | 331/11 |
| 4,590,602 | 5/1986 | Wolaver . | |
| 4,603,304 | 7/1986 | Burns et al. | 331/2 |
| 4,787,097 | 11/1988 | Rizzo | 375/120 |
| 4,856,085 | 8/1989 | Horvat . | |
| 4,940,952 | 7/1990 | Kegasa | 331/11 |
| 4,942,370 | 7/1990 | Shigemori | 331/1 A |
| 5,157,355 | 10/1992 | Shikakura et al. . | |
| 5,414,390 | 5/1995 | Kovacs et al. | 331/2 |
| 5,446,416 | 8/1995 | Lin et al. | 331/11 |
| 5,525,935 | 6/1996 | Joo et al. | 331/11 |

FOREIGN PATENT DOCUMENTS 0 402 113   12/1990   European Pat. Off. .
0 654 907 A1   5/1995   European Pat. Off. .

*Primary Examiner*—David Mis
*Attorney, Agent, or Firm*—Merchant & Gould P.C.

[57] ABSTRACT

A Steered Frequency Phase Lock Loop (SFPLL) comprises a phase loop that functions like a normal phase locked loop (PLL) and locks to the input signal, and a frequency loop that uses a reference frequency to influence the phase loop and effectively confines the output frequency of the phase loop and the SFPLL to be in a range of frequencies close to the reference frequency. The reference frequency is chosen to be very close to the input signal frequency that it is desired the SFPLL lock to. The SFPLL comprises a phase detector (10), a frequency detector (22), first and second gain components (12, 24), first, second and third filter components (14, 18, 26), a summer (16) and a voltage controlled oscillator (VCP)(20). By a judicious choice of the gains in the phase and frequency loops the SFPLL can be designed so that the range of frequencies to which the SFPLL will lock can be confined to an arbitrarily small region around the reference frequency ($\omega'_r$). Applications of the SFPLL include demodulation in CW modulation systems and timing recovery from NRZ data. Three advantages of the SFPLL are that the output frequency is equal or close to the reference frequency when no input signal is present, and the range of frequencies to which the SFPLL can lock is confined to a region around the reference frequency, and the phase and frequency instabilities of the VCO can be reduced.

12 Claims, 16 Drawing Sheets

STEERED FREQUENCY PHASE LOCKED LOOP

FIELD OF THE INVENTION

This invention relates to improvements in Phase Locked Loops (PLL) and relates particularly to a Steered Frequency Phase Locked Loop (SFPLL). The SFPLL is a system that exhibits PLL like behaviour but the range of frequencies to which it can lock is controlled. This invention has applications in many diverse areas of electronics, for example: timing recovery in base-band digital transmission, demodulation in continuous wave (CW) modulation systems, and filtering of electrical signals.

BACKGROUND TO THE INVENTION

Most conventional PLLs have problems with false locking onto unwanted input signals, or unwanted spectral components of the input signal. The SFPLL avoids this false locking problem as the range of frequencies to which the SFPLL can lock can be confined to an arbitrarily small region around the desired input signal (providing of course the frequency of the input signal is known with sufficient accuracy). The SFPLL typically will not false lock providing there are no unwanted input signals, or unwanted spectral components of the input signal, in the range of frequencies to which the SFPLL can lock.

Exceptionally accurate positioning and confinement of the locking range of the SFPLL can be achieved by use of precise frequency detectors and an accurate reference frequency $\omega'_r$.

SUMMARY OF THE INVENTION

According to one aspect of the present invention there is provided a steered frequency phase locked loop (SFPLL) comprising:
a phase loop having a first input signal and an output signal and which is adapted to lock the phase of the output signal to that of the input signal; and,
a frequency loop operatively coupled to the phase loop and having a second input signal providing a reference frequency, wherein the frequency loop uses the reference frequency to steer the phase loop and effectively confines the range of frequencies to which the phase loop can lock close to the reference frequency.

Preferably said phase loop comprises a phase detector, and a voltage controlled oscillator operatively coupled to an output of said phase detector, an output of said voltage controlled oscillator being connected to an input of said phase detector to complete the phase loop.

Preferably said frequency loop comprises a frequency detector, and means for summing respective output signals of said phase detector and frequency detector and supplying the sum to said voltage controlled oscillator, the output of said voltage controlled oscillator being connected to an input of said frequency detector to complete the frequency loop.

Preferably said phase loop and frequency loop further comprise first and second gain components respectively. Preferably said SFPLL further comprises a first signal filtering means operatively connected between said summing means and said voltage controlled oscillator.

Typically said phase loop has a second signal filtering means operatively connected to the output of said phase detector for filtering the output signal from said phase detector. Typically said frequency loop has a third signal filtering means operatively connected to an output of said frequency detector for filtering the output signal of said frequency detector.

Advantageously the SFPLL can be applied to demodulation in continuous wave (CW) modulation systems (both AM and FM), or to timing recovery from a data stream.

Like conventional PLLs the SFPLL takes an input signal which it is required to phase lock to. In addition to this input signal, the SFPLL has an accurate reference frequency input of frequency $\omega'_r$. The reference frequency $\omega'_r$ is chosen to be close to (though not necessarily the same as) the frequency of the input signal which the SFPLL is required to phase lock to. Three key advantages of the SFPLL are: the output frequency is $\omega'_r$ (or is close to $\omega'_r$) when no input signal is present, the range of frequencies to which the SFPLL can lock is confined to a region around $\omega'_A$, and the phase and frequency instabilities of the VCO are reduced.

BRIEF DESCRIPTION OF THE DRAWINGS

In order to facilitate a more comprehensive understanding of the nature of the invention a preferred embodiment of the SFPLL will now be described in detail together with some possible applications, by way of example only, with reference to the accompanying drawings in which.

DETAILED DESCRIPTION OF PREFERRED EMBODIMENTS

Figure 1:
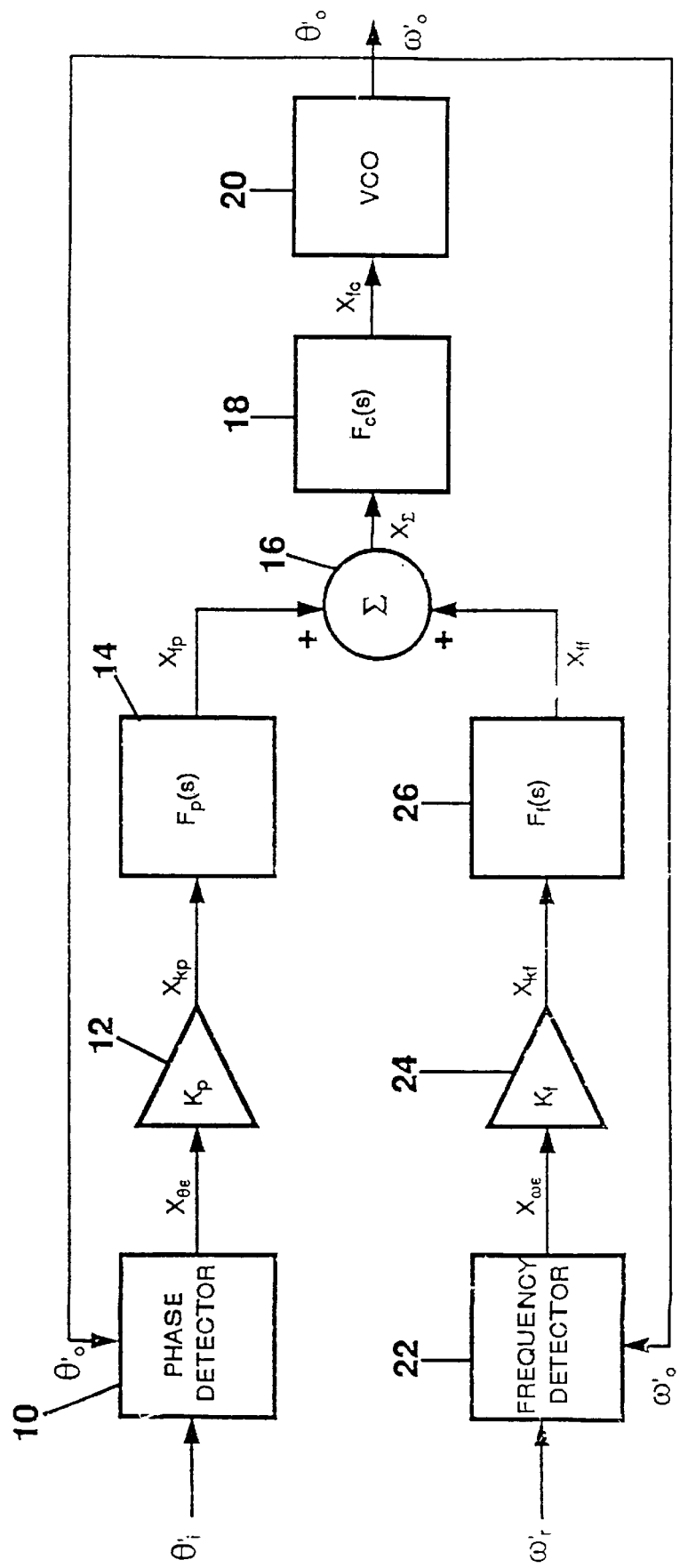
FIG. 1 is a functional block schematic circuit diagram for a preferred embodiment of the SFPLL.

A circuit diagram for a preferred embodiment of the SFPLL is illustrated in FIG. 1 in functional block schematic form. Each of the components of the preferred embodiment of the SFPLL are connected by electrical connections represented in FIG. 1 by arrowed lines. The signal information on the electrical connections may be in the form of a static or time varying voltage or current. In FIG. 1 the signal value on the electrical connections is generally denoted by "x" with a subscript. The only exceptions are the input and output signals. The SFPLL has two electrical input signals, a first input signal $\theta'_i$ radians, which is a time varying signal that the SFPLL will try to lock to, and a second input signal which is a time varying signal providing a reference frequency $\omega'_r$ radians per second. The first input signal has a frequency $\omega'_i$ and a phase of $\theta'_i$. The SFPLL has one output signal which is a time varying signal of frequency $\omega'_o$ radians per second and phase $\theta'_o$.

The preferred embodiment of the SFPLL as illustrated in FIG. 1 comprises a phase detector 10, a first gain component 12, a first filter component 14, a summer 16, a second filter component 18, a voltage controlled oscillator (VCO) 20, a frequency detector 22, a second gain component 24 and a third filter component 26. The phase detector 10 outputs a signal that is in the ideal case a linear function of the phase difference between the two inputs $\theta'_i$ and $\theta'_o$:

$$X_{\theta\epsilon} = K_{pd}(\theta'_i - \theta'_o) \tag{1}$$

where $K_{pd}$ is the phase detector gain. The frequency detector 22 outputs a signal that is in the ideal case a linear function of the frequency difference between the two inputs $\omega'_r$ and $\omega'_o$:

$$X_{\omega\epsilon} = K_{fd}(\omega'_r - \omega'_o) \tag{2}$$

where $K_{fd}$ is the frequency detector gain. The first gain component 12 simply introduces a constant gain of $K_p$ to the output signal of the phase detector 10:

$$X_{kp} = K_p X_{\theta\epsilon} \tag{3}$$

The second gain component 24 simply introduces a constant gain of $K_f$ to the output signal of frequency detector 22:

$$X_{kf} = K_f X_{\omega\epsilon} \tag{4}$$

The first filter component 14 filters the output signal of the first gain component 12 and may be described by a transfer function of the form:

$$F_p(s) = \frac{\left(\frac{s}{\omega_{z1}}+1\right)\left(\frac{s}{\omega_{z2}}+1\right)\ldots\left(\frac{s}{\omega_{znp}}+1\right)}{\left(\frac{s}{\omega_{p1}}+1\right)\left(\frac{s}{\omega_{p2}}+1\right)\ldots\left(\frac{s}{\omega_{pmp}}+1\right)} \tag{5}$$

There are $n_p$ zeros at frequencies: $\omega_{z1}, \omega_{z2}, \ldots \omega_{znp}$. There are $m_p$ poles at frequencies: $\omega_{p1}, \omega_{p2}, \ldots \omega_{pmp}$. Note that there are no poles or zeros with $\omega_z$ or $\omega_p$ equal to 0, i.e., no poles or zeros at the origin. In the frequency domain the output of the first filter component 14 is related to the input as follows:

$$X_{fp}(s) = F_p(s) X_{kp}(s) \tag{6}$$

The second filter component 26 filters the output signal of the second gain component 24 and may be described by a transfer function of the form:

$$F_p(s) = \frac{\left(\frac{s}{\omega_{z1}}+1\right)\left(\frac{s}{\omega_{z2}}+1\right)\ldots\left(\frac{s}{\omega_{znf}}+1\right)}{\left(\frac{s}{\omega_{p1}}+1\right)\left(\frac{s}{\omega_{p2}}+1\right)\ldots\left(\frac{s}{\omega_{pmf}}+1\right)} \tag{7}$$

There are $n_f$ zeros at frequencies: $\omega_{z1}, \omega_{z2}, \ldots \omega_{znf}$. There are $m_f$ poles at frequencies: $\omega_{p1}, \omega_{p2}, \ldots \omega_{pmf}$. Note that there are no poles or zeros with $\omega_z$ or $\omega_p$ equal to 0, i.e., no poles or zeros at the origin. In the frequency domain the output of the first filter component 14 is related to the input as follows:

$$X_{ff}(s) = F_f(s) X_{kf}(s) \tag{8}$$

The output of the summer 16 is the sum of its two inputs, and in the ideal case the summer is described by the following equation:

$$X_\Sigma = X_{fp} + X_{ff} \tag{9}$$

The third filter component filters the output of the summer 16, and may be described by a transfer function of the form:

$$F_c(s) = \frac{\left(\frac{s}{\omega_{z1}}+1\right)\left(\frac{s}{\omega_{z2}}+1\right)\ldots\left(\frac{s}{\omega_{znc}}+1\right)}{\left(\frac{s}{\omega_{p1}}+1\right)\left(\frac{s}{\omega_{p2}}+1\right)\ldots\left(\frac{s}{\omega_{pmc}}+1\right)} \tag{10}$$

There are $n_c$ zeros at frequencies: $\omega_{z1}, \omega_{z2}, \ldots \omega_{znc}$. There are $m_c$ poles at frequencies: $\omega_{p1}, \omega_{p2}, \ldots \omega_{pmc}$. Note that there are no poles or zeros with $\omega_z$ or $\omega_p$ equal to 0, i.e., no poles or zeros at the origin. The transfer function may also contain one or more poles at the origin and thus can also be of the form:

$$F_c(s)_{(s\ldots s)} = \frac{\left(\frac{s}{\omega_{z1}}+1\right)\left(\frac{s}{\omega_{z2}}+1\right)\ldots\left(\frac{s}{\omega_{znc}}+1\right)}{\left(\frac{s}{\omega_{p1}}+1\right)\left(\frac{s}{\omega_{p2}}+1\right)\ldots\left(\frac{s}{\omega_{pmc}}+1\right)} \tag{11}$$

In the frequency domain the output of the first filter is related to the input as follows:

$$X_{fc}(s) = F_c(s) X_\epsilon(S) \tag{12}$$

The VCO 20 produces a signal of frequency $\omega'_o$ at its output. The VCO 20 has a free running frequency of $\omega_c$ (i.e. when the input is zero). The VCO deviates from the free running frequency depending on the input. Ideally the relationship between the input and the output frequency is linear as follows:

$$\omega'_o = \omega_c + K_{vco} X_{fc} \tag{13}$$

The SFPLL may be considered as two subsections:
(i) a phase loop consisting of the phase detector 10, first gain component 12, first filter component 14, summer 16, third filter component 18 and VCO 20; and,
(ii) a frequency loop consisting of the frequency detector 22, second gain component 24, third filter component 26, summer 16, second filter component 18 and VCO 20. In operation the phase loop functions like a normal phase locked look (PLL) and locks to the input signal $\theta'_i$. The frequency loop uses the reference frequency $\omega'_r$ to confine the output frequency of the phase loop and the SFPLL, $\omega'_o$, to be in a range of frequencies close to the reference frequency $\omega'_r$. The reference frequency is chosen to be close to the input signal frequency $\omega'_i$ that it is desired the SFPLL lock to. The confining of the output frequency $\omega'_o$ by the frequency loop may be understood as follows:

The detectable phase difference between $\theta'_o$ and $\theta'_i$ is limited to an absolute value, $\theta_{\epsilon max}$, typically less than or equal to $2\pi$. Hence the phase error output of the phase detector 10 is limited to $X_{\omega\epsilon max}$:

$$X_{\omega\epsilon max}=K_{pd}\theta_{\epsilon max} \qquad (14)$$

Hence the average value of the phase loop input to the summer 16 is limited to $X_{fpmax}$;

$$X_{fpmax}=K_p K_{pd}\theta_{\epsilon max} \qquad (15)$$

The average value of the frequency loop into the summer 16 may then be represented as follows:

$$X_{ff}=K_f K_{fd}(\omega'_r-\omega'_o) \qquad (16)$$

By a judicious choice of the gains in the phase and frequency loops (i.e. $K_{pd}$, $K_{fd}$, $K_p$, $K_f$) the average value of the frequency loop input to the summer 16, $X_{ff}$, can be made greater than $X_{fpmax}$ when $\omega'_o$ deviates from $\omega'_r$ by more than a chosen amount $\omega_{maxdev}$. Thus the phase loop is unable to lock to frequencies that deviate more than $\omega_{maxdev}$ from $\omega'_r$ as the phase loop cannot overcome the frequency loop pulling of the VCO frequency back towards $\omega'_r$. In this way, the frequency loop steers the operation of the phase loop so as to confine the output frequency $\omega'_o$ to be in a range of frequencies close to the reference frequency $\omega'_r$.

An analysis of a small signal linear model of the SFPLL illustrated in FIG. 1 reveals the following characteristics:

1. For the case where $F_c(s)$ doesn't contain a pole at the origin, the output frequency of the SFPLL tends to $\omega'_r$ as the product of all the gains in the frequency loop $K_{f1}$ tends to infinity, when the phase error $\theta_\epsilon(s)=0$, for example when the input signal is zero.
2. For the case where $F_c(s)$ does contain a pole at the origin, the output frequency of the SFPLL equals $\omega'_r$ when $\theta_\epsilon(s)=0$.
3. If the SFPPL is to lock to a constant input frequency $\omega$. Then a constant phase error between the input phase $\theta_i$, and the output phase $\theta_o$. is induced by the SFPLL. The magnitude of this phase error depends upon the difference between the input frequency $\omega$ and reference frequency $\omega'_r$. And also the ratio of the product of all the gains in the frequency loop $K_{f1}$, to the product of all the gains in the phase loop $K_{p1}$.
4. Due to the finite amount of phase error (induced by the process described in the above paragraph) the range of frequencies to which the SFPLL can lock is limited. The range of frequencies is exactly centred on $\omega_r$ for the case where $F_c(s)$ does contain a pole at the origin. The extent of the range is determined by the ratio of $K_{p1}$ and $K_{f1}$.
5. With the filters $F_p(s)$, $F_f(s)$ and $F_c(s)$ selected appropriately, the action of the frequency loop can reduce the phase and frequency instabilities of the VCO.

The three key advantages of the preferred embodiment of the SFPLL are: the output frequency is equal to the reference frequency $\omega_r$ (or is close to $\omega_r$) when no input signal is present. The range of frequencies to which the SFPLL can lock is confined to a region around $\omega_r$. And, the phase and frequency instabilities of the VCO can be reduced by the action of the frequency loop.

In the following sections a number of extensions to the basic SFPLL are described. These extensions may be used individually or in combination, depending on the requirements of the particular application.

Offset in frequency loop to change effective reference frequency

Figure 2:
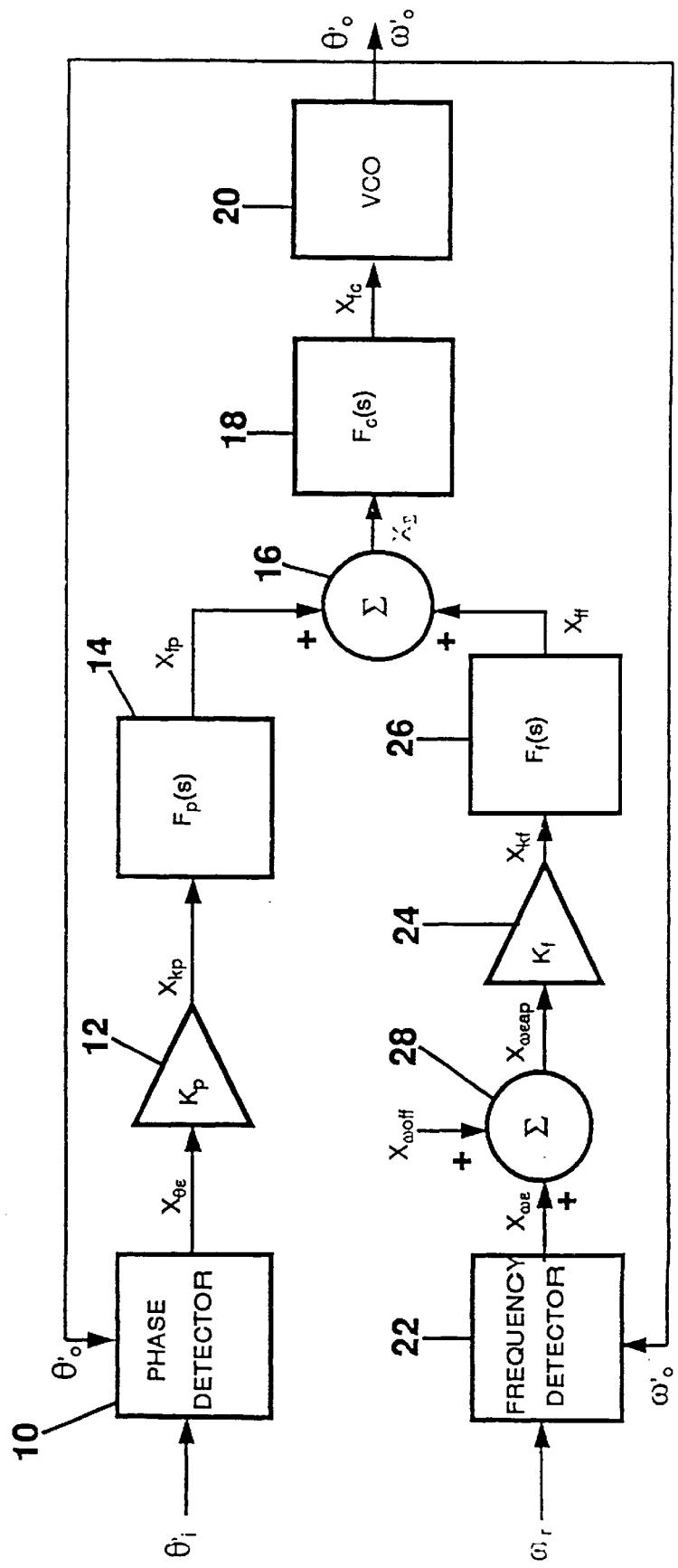
FIG. 2 is a modification of the SFPLL illustrated in FIG. 1 with offset in the frequency loop.

The apparent reference frequency ($\omega'_{rap}$) can be offset from the real reference frequency ($\omega'_r$) by adding a constant offset signal into the frequency loop. A SFPLL modified to achieve this frequency offset is shown in FIG. 2. The components numbered 10 to 26 in FIG. 2 are the same as components 10 to 26 in FIG. 1, and are described above. The inputs and output are also the same as the inputs and output in FIG. 1.

An additional component in FIG. 2, is a summer 28 which in the ideal case is described by the following equation:

$$X_{\omega\epsilon ap}=X_{\omega\epsilon}+X_{\omega off} \qquad (17)$$

From an analysis of a small signal linear model for the SFPLL with reference frequency offset, it becomes evident that the effect of the constant offset signal is to offset the real reference frequency ($\omega_r$) to an apparent reference frequency ($\omega_{rap}$). The apparent reference frequency $\omega_{rap}$ can be precisely and arbitrarily offset from the real reference frequency, provided the frequency detector 22 is precise and linear, and the summer 28 is precise. This offsetting of the reference frequency is very useful in some applications as the SFPLL can be centred on any number of arbitrary frequencies just by changing the offset value $X_{\omega off}$.

Using frequency error information to correct induced phase error

Figure 3:
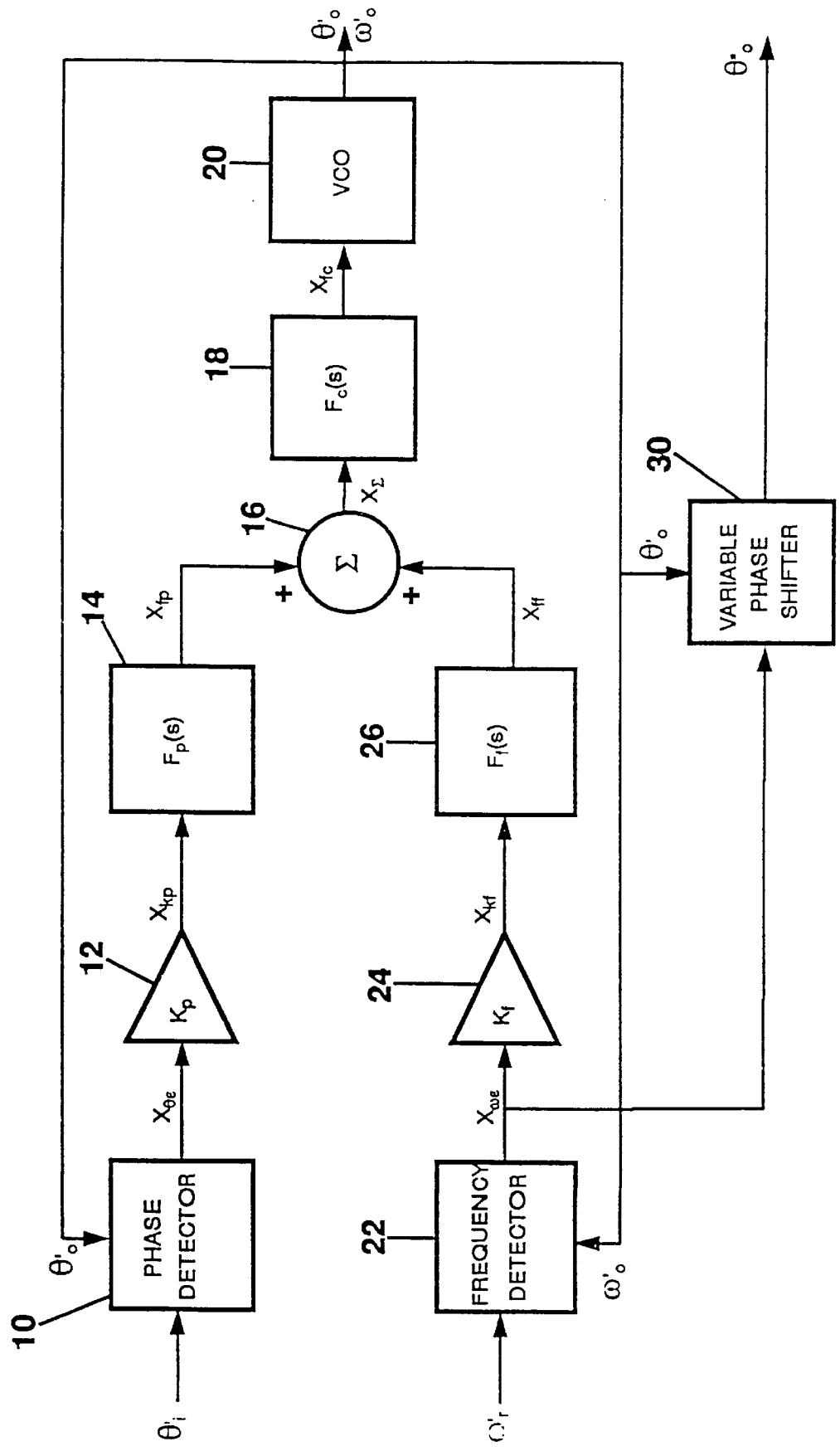
FIG. 3 is a modification of the SFPLL illustrated in FIG. 1 with correction of induced phase error.

The frequency error output from the frequency detector 22 in FIG. 1 can be used to correct the induced phase error $\omega_\epsilon$ in the SFPLL output $\omega'_o$. The modified SFPLL to perform this function is shown in FIG. 3. The components numbered 10 to 26 in FIG. 3 are the same as components 10 to 26 in FIG. 1, and will not be described again here. The inputs and output are also the same as the inputs and output in FIG. 1, however there is an additional output, $\theta''o$, which is in phase with the input signal $\theta'i$.

In FIG. 3 the circuit of FIG. 1 is modified by the addition of a variable phase shifter 30 which in the ideal case shifts the phase $\theta'_o$ of the output signal by $\theta_\Delta$ radians according to the equation:

$$\theta_\Delta = \frac{K_f X_{\omega e}}{K_p K_{pd}} \qquad (18)$$

This phase shift $\theta_\Delta$ radians corrects the phase error $\theta_\epsilon$ induced by the SFPLL.

Dual SFPLL configuration to achieve zero phase and frequency error

Figure 4:
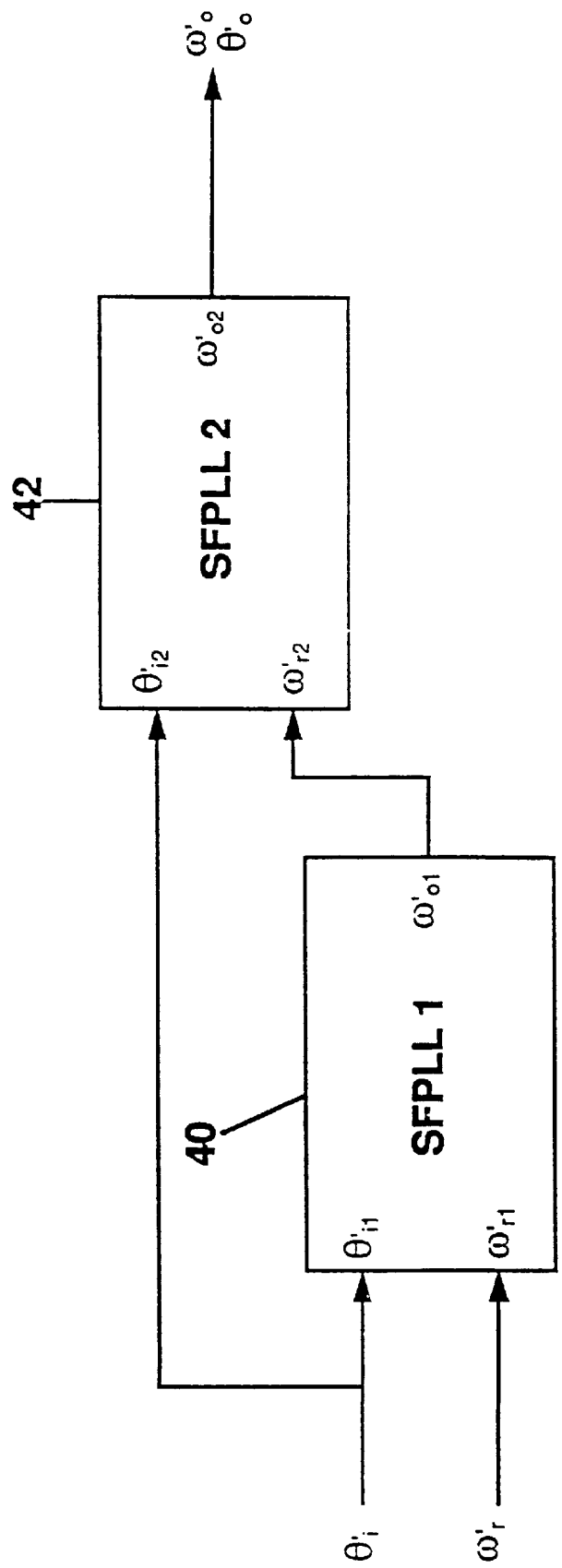
FIG. 4 is a modification of the SFPLL illustrated in FIG. 1 with zero phase and frequency error.

It is possible to use two SFPLLs to correct the induced phase error $\theta_\epsilon$, and obtain an output $\theta'_o$ that is in phase with the input $\theta'_i$. The arrangement of two SFPLLs 40,42 is shown in FIG. 4. The Dual SFPLL configuration has a reference frequency input $\omega'_r$, a signal input $\theta'_i$, and an output $\omega'_o$ ($\theta'_o$). These two inputs and output correspond to the two inputs ($\theta'_i$ and $\omega'_r$) and output ($\omega'_o$) of the standard SFPLL illustrated in FIG. 1. The reference frequency input ($\omega'_r$) is used by SFPLL 40. SFPLL 40 extracts the frequency of the signal input ($\theta'_i$) and passes this output ($\omega'_{o1}$) to the reference frequency input of SFPLL 42. Since the reference frequency input of SFPLL 42 is the frequency of the signal input ($\theta'_i$), no phase error is induced in SFPLL 42, and there is no phase difference between $\omega'_i$ and $\omega'_o$.

Example application 1: demodulation in CW modulation systems

This section shows how the SFPLL system can be applied to the problem of demodulation in CW modulation systems.

AM demodulation

Figure 5:
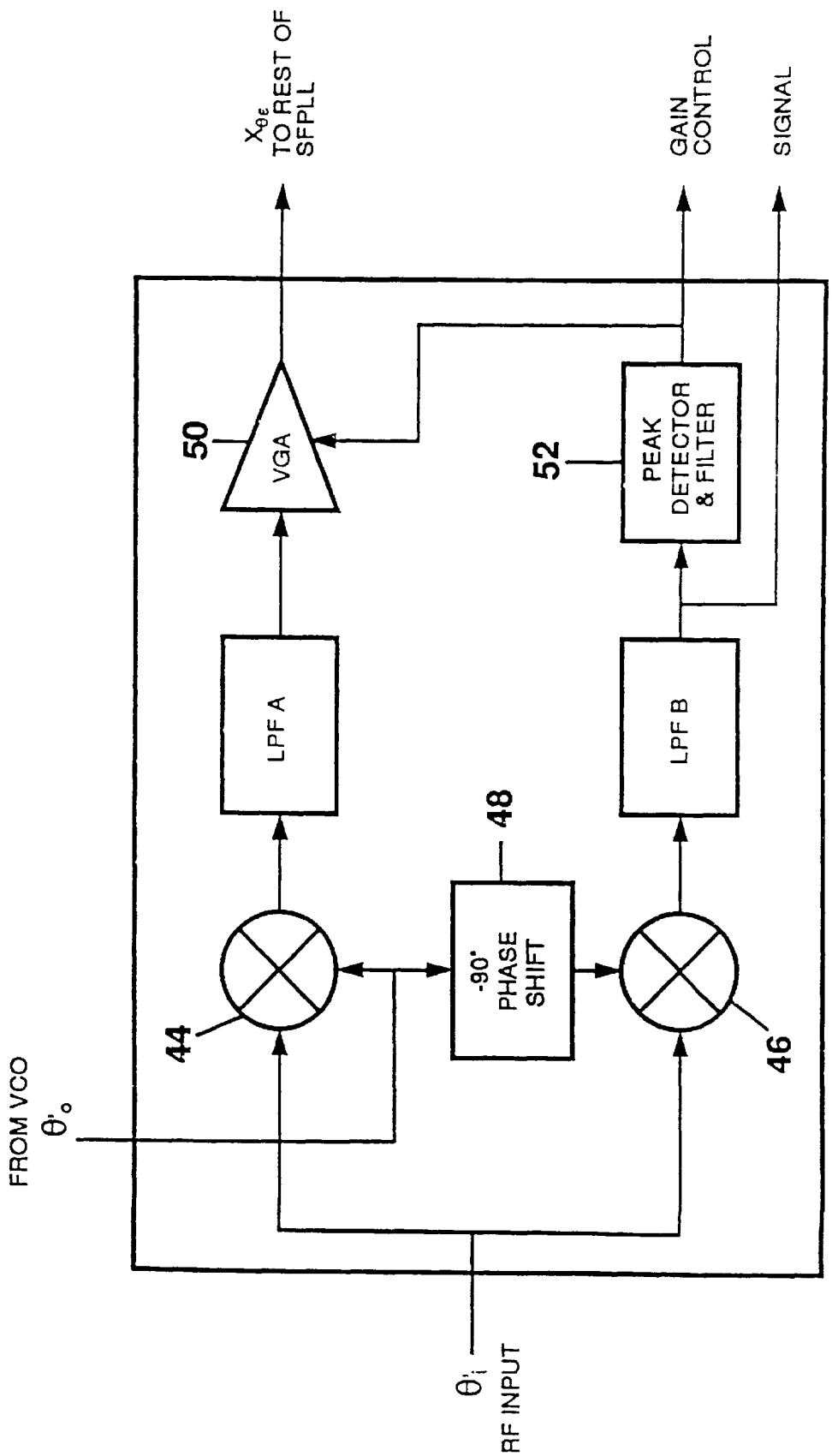
FIG. 5 is a functional block schematic circuit diagram of a phase detector for an application of the SFPLL to AM demodulation.

To achieve AM demodulation the preferred SFPLL structure shown in FIG. 1 can be used. A specific form of phase detector (component 10 in FIG. 1) is required though. A phase detector which is suitable for AM demodulation is shown in FIG. 5. The phase detector of FIG. 5 has two electrical inputs:

(1) A radio frequency (RF) input $\theta'_i$, which corresponds to the $\theta'_i$, input of the SFPLL in FIG. 1. Typically the RF input will contain a limited range of frequencies which contain a number of AM channels e.g. broadcast AM with a frequency range of 531 to 1602 kHz. The task of the SFPLL is to filter out and demodulate a particular AM channel.

(2) The input from the VCO $\theta'_o$. This corresponds to the $\theta'_o$, input of the phase detector 10 in FIG. 1.

The phase detector of FIG. 5 has two electrical outputs:

(1) The output $X_{\theta\epsilon}$ to the rest of the SFPLL, which corresponds to the $X_{\theta\epsilon}$ output of the phase detector 10, in FIG. 1.

(2) The demodulated signal output and the gain control output, for example: in broadcast AM demodulation these outputs would go to an audio amplifier and speaker for conversion into sound.

The phase detector for AM demodulation illustrated in FIG. 5 comprises a first mixer 44 which mixes the RF input $\theta'_i$ and the VCO input $\theta'_o$, down-converting the desired AM channel frequency down to DC (direct current). A second mixer 46 mixes the RF input $\theta'_i$ and the VCO $\theta'_o$ shifted by minus 90° by a phase shifter 48, down-converting the desired AM channel frequency down to DC (direct current). Note that the RF port of both the first and second mixers 44, 46 is linear. The phase detector of FIG. 5 further comprises a first low pass filter (LPF A) which filters out higher frequencies from the mixer 44, allowing only DC and low frequencies through. A second low pass filter (LPF B) filters out higher frequencies from the mixer 46, allowing only DC and the frequencies associated with the demodulated signal through. For example, for broadcast AM the filter LPF B would block all frequencies above 7.5 kHz, which is the highest frequency of the demodulated signal. A variable gain amplifier (VGA) 50 amplifies the output of LPF A. The amount of amplification (gain) is variable and is controlled by the output of a peak detector 52. The peak detector and filter 52 determines the peak amplitude of the output signal from LPF B, and also filters this peak amplitude value.

The reference frequency input for the SFPLL $\omega'_r$ is set to be very close to the frequency of the desired AM channel. Mixer 44 acts as a phase detector. Since the amplitude of the RF input signal $\theta'_i$ at the desired AM channel frequency is unknown, the magnitude of the output of mixer 44 and hence the output of LPF A is unknown. Mixer 46 is used to determine the amplitude of the RF input signal $\theta'_i$ at the desired AM channel frequency. The peak detector 52 determines the amplitude of the RF input signal from the peaks of the signal output from LPF B. Some filtering of this peak value from the peak detector is required since for AM the RF input signal is amplitude modulated. The information about the amplitude of the RF input signal $\theta'_i$ at the desired AM channel frequency is used by the VGA 50. The VGA 50 amplifies the phase error information from LPF A and mixer 44. The output of the VGA 50 now contains phase error information $X_{\theta\epsilon}$ with a known and fixed phase error to amplitude relationship (i.e. $K_{pd}$ in equation (1) is fixed).

The phase error information $X_{\theta\epsilon}$ is then fed to the rest of the SFPLL. In steady state operation the SFPLL locks to the carrier of the desired AM channel, and the demodulated output can be taken from the output of LPF B. In this application the SFPLL can be confined to lock only to a range of frequencies very close to the carrier frequency of the desired AM channel. Thus locking onto side-bands or other AM channels is avoided. This ability to lock to only a small range of frequencies near the desired frequency avoids the need to use intermediate frequency (IF) filters and circuits to separate out the desired AM channel from other AM channels. Effectively the SFPLL performs the function of an accurately positioned narrow bandwidth band-pass tracking filter. With no IF stages all of the circuits besides the VCO (component 20 FIG. 1), the RF input signal circuits and mixers 44 & 46 operate at only the demodulated signal frequency or lower. These lower frequency circuits can be made with low performance and low cost components.

To select various AM channels the method to change the reference frequency $\omega'_r$ as described above with reference to FIG. 2 can be used. Using this frequency offsetting technique only one accurate reference frequency is required to receive all AM channels. Mixer B requires its input $\theta'_o$ to be exactly in phase with $\theta'_i$ to get maximum demodulated signal output. Some phase error $\theta_e$ will be induced by the SFPLL. The phase error may be significant if the SFPLL is tightly confined close to the carrier frequency. The techniques described above with reference to FIGS. 3 and 4 can be used to eliminate this phase error.

FM demodulation

The application of a SFPLL for FM (frequency modulation) demodulation turns out to be very similar to the application of a SFPLL for AM demodulation. To achieve FM demodulation the preferred SFPLL structure shown in FIG. 1 can again be used. A specific form of phase detector 10 is required though. A phase detector which is suitable for FM demodulation is shown in FIG. 6.

Figure 6:
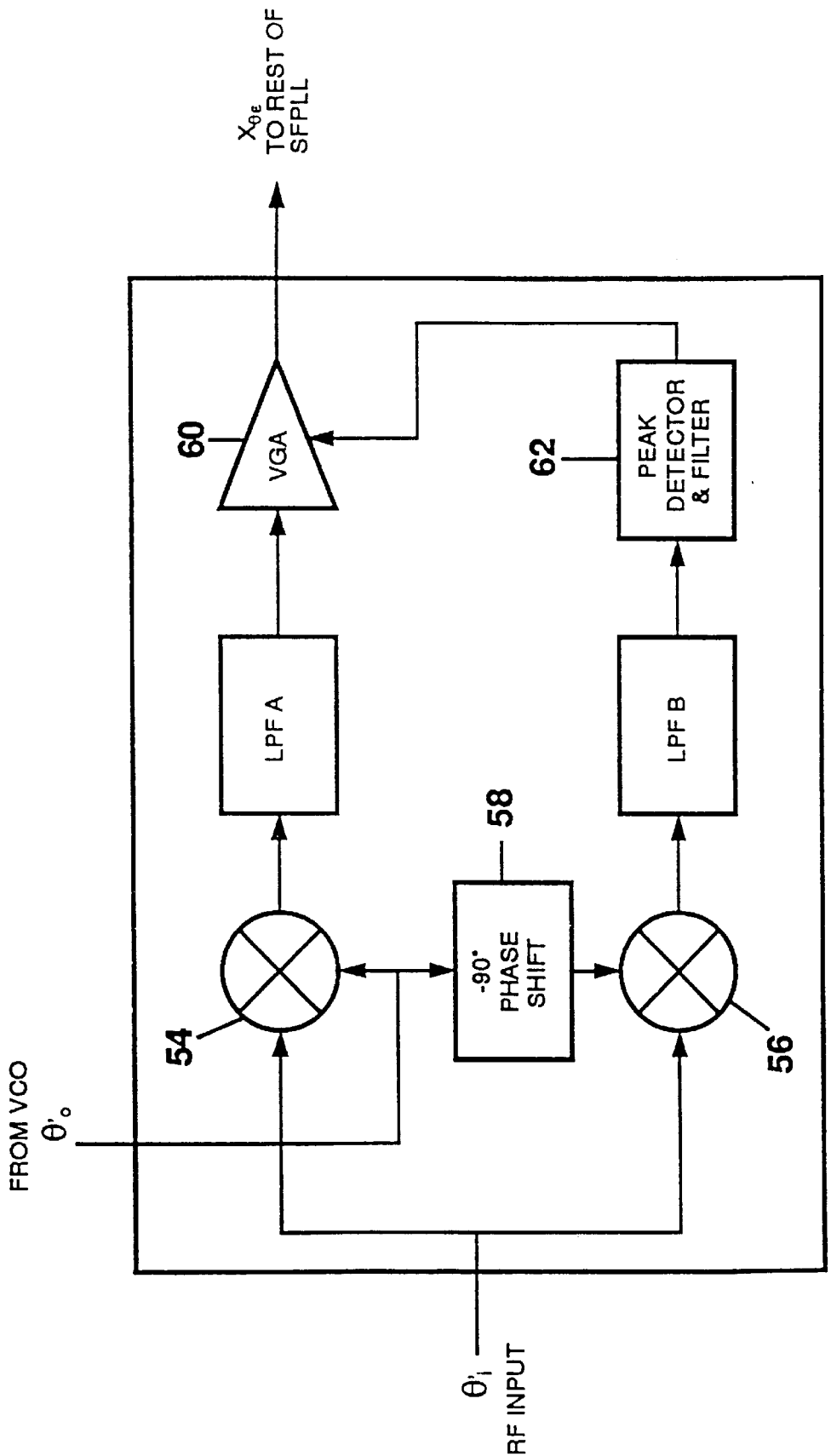
FIG. 6 is a functional block schematic circuit diagram of a phase detector for an application of the SFPLL to FM demodulation.

The phase detector of FIG. 6 has two electrical inputs:

(1) The radio frequency (RF) input $\theta'_i$ which corresponds to the $\theta'_i$, input of the SFPLL in FIG. 1. Typically the RF input will contain a limited range of frequencies which contains a number of FM channels e.g. broadcast FM with a frequency range of 88 to 108 MHz. The task of the SFPLL is to filter out and demodulate a particular FM channel.

(2) The input from the VCO $\theta'_o$, which corresponds to the $\theta'_o$, input of the phase detector 10 in FIG. 1.

The phase detector of FIG. 6 has one electrical output:

(1) The output $X_{\theta\epsilon}$ to the rest of the SFPLL which corresponds to the $X_{\theta\epsilon}$ output of the phase detector 10 FIG. 1.

The phase detector for FM demodulation illustrated in FIG. 6 comprises a first mixer 54 which mixes the RF input $\theta'_i$ and the VCO input $\theta'_o$, down-converting the desired FM channel frequency down to DC (direct current). A second mixer 56 mixes the RF input $\theta'_i$ and the VCO input $\theta'_o$ shifted by −90° by a phase shifter 58, down-converting the desired FM channel frequency down to DC (direct current). Note that the RF port of both the first and second mixers 54, 56 is linear. The phase detector of FIG. 6 further comprises a first low pass filter A (LPF A) which filters out higher frequencies from the first mixer 54, allowing only DC and the frequencies associated with the demodulated signal through. For example, for broadcast FM the filter LPF A would block all frequencies above 15 kHz, which is the highest frequency of the demodulated signal. A second low pass filter B (LPF B) filters out higher frequencies from the second mixer 56, allowing only DC and low frequencies through. A variable gain amplifier (VGA) 60 amplifies the output signal of LPF A. The amount of amplification (gain) is variable and is controlled by the output of a peak detector 62. Peak detector and filter 62 determines the peak amplitude of the signal coming out of the second low pass filter LPF B, and also filters this peak amplitude value.

The reference frequency input for the SFPLL $\omega'_r$ is set to be very close to the frequency of the desired FM channel. Mixer 54 acts as a phase detector. Since the amplitude of the RF input signal $\theta'_i$ at the desired FM channel frequency is unknown, the magnitude of the output of mixer 54 and hence the output of LPF A is unknown. Mixer 56 is used to determine the amplitude of the RF input signal $\theta'_i$ at the desired FM channel frequency. The peak detector 62 determines the amplitude of the RF input signal from the peaks of the signal output from LPF B. Some filtering of this peak value from the peak detector is required as when the SFPLL isn't locked to $\theta'_i$ at start-up, the output of the LPF B will be a time varying value.

The information about the amplitude of the RF input signal $\theta'_i$ at the desired FM channel frequency is used by the VGA 60. The VGA 60 amplifies the phase error information from LPF A and mixer 54. The output of the VGA now contains phase error information $X_{\theta\epsilon}$ with a known and fixed phase error to amplitude relationship (i.e. $K_{pd}$ in equation (1) is fixed). The phase error information $X_{\theta\epsilon}$ is then fed to the rest of the SFPLL. In steady state operation the SFPLL locks to and tracks the varying frequency of the desired FM channel. The demodulated output is taken from input of the VCO (component 20 FIG. 1) $X_{fc}$.

The SFPLL can be confined to lock in the long term only to a range of frequencies very close to the centre frequency of the desired FM channel. Thus locking onto side-bands or other FM channels is avoided. This ability to lock to only a small range of frequencies near the desired frequency avoids the need to use intermediate frequency (IF) filters and circuits to separate out the desired FM channel from other FM channels. Effectively the SFPLL performs the function of an accurately positioned narrow bandwidth band-pass tracking filter. With no IF stages all of the circuits besides the VCO (component 20 FIG. 1), the RF input signal circuits and mixers 54 & 56 operate at only the demodulated signal frequency or lower. These lower frequency circuits can be made with low performance and low cost components.

To select various FM channels the method of changing the reference frequency $\omega'_r$ as described above with reference to FIG. 2 can be used. Using this frequency offsetting technique only one accurate reference frequency is required to receive all FM channels.

Example Application 2: Timing Recovery from NRZ Data

This section presents a system that employs the SFPLL technique to recover timing from a NRZ (NonReturn to Zero) data stream. Firstly the phase and frequency detector used in the SFPLL timing recovery system are described. A possible structure of the timing recovery system is presented in the System Overview section. Then in subsequent sections, timing recovery system components are examined, and parameters for the components are determined and related back to system requirements. The features and advantages of the SFPLL are discussed. Finally, full details of an actual implementation are given.

Phase and Frequency Detectors

This section describes the phase and frequency detectors used in the SFPLL timing recovery system. The particular phase and frequency detectors were chosen for their digital nature, allowing them to be easily realised with digital integrated circuit technology. Also, the digital nature of the frequency detector allows its output to be measured and manipulated to whatever degree of accuracy is required.

Figure 7:
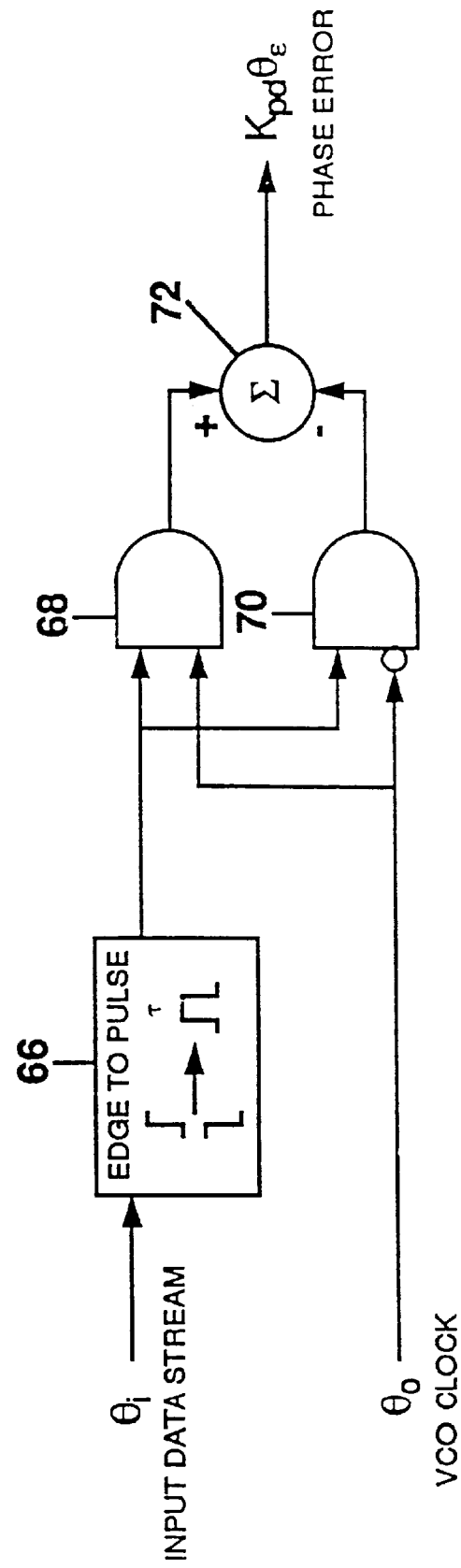
FIG. 7 is a functional block schematic circuit diagram of a phase detector for an application of the SFPLL to timing recovery from a NRZ data stream.
Figure 8:
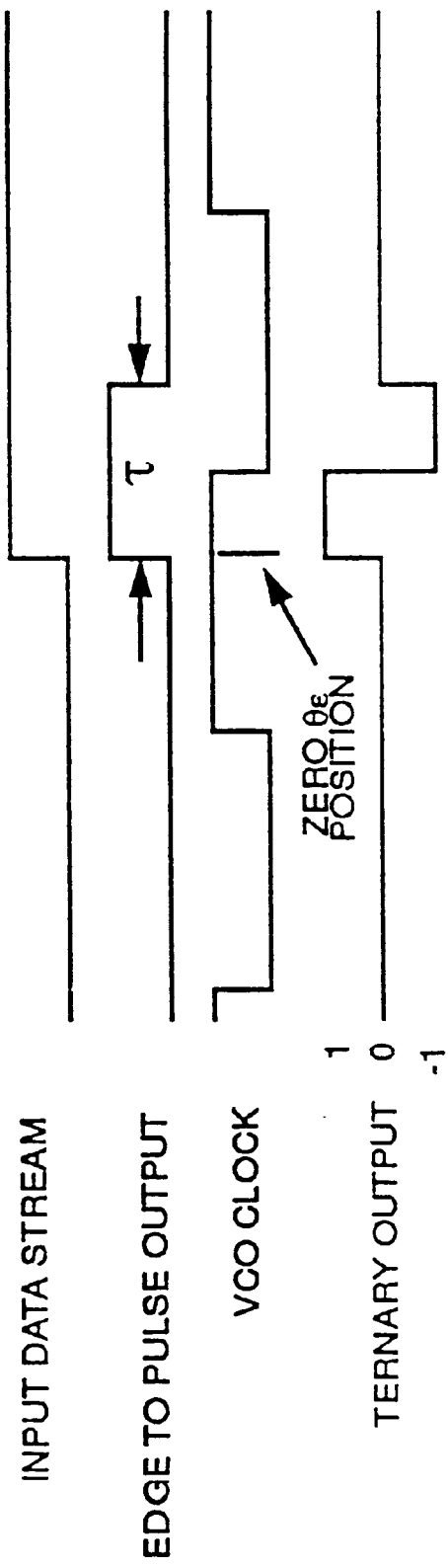
FIG. 8 is a timing diagram for the phase detector of FIG. 7.

The structure of a preferred embodiment of the phase detector for the SFPLL timing recovery system is illustrated in FIG. 7. This particular phase detector is suitable for timing recovery from a NRZ data stream, because phase error output is only generated when there is a transition in the input data stream. When the input data stream is absent (i.e. no transitions) the output of the phase detector is zero. An edge to pulse convertor 66 of the phase detector generates pulses of width $\tau$ when a transition occurs in the input data stream. The pulse from the edge to pulse convertor is ANDed (68) with the VCO clock and the inverse (70) of the VCO clock. The output of the two AND gates is summed (72) to form a ternary output i.e. 1, 0, −1. The actual phase error is found by taking the average value of the ternary output. The zero phase error position occurs when the pulse from the edge to pulse convertor straddles the one to zero transition of the VCO clock. This zero phase error position is illustrated in FIG. 8.

Figure 9:
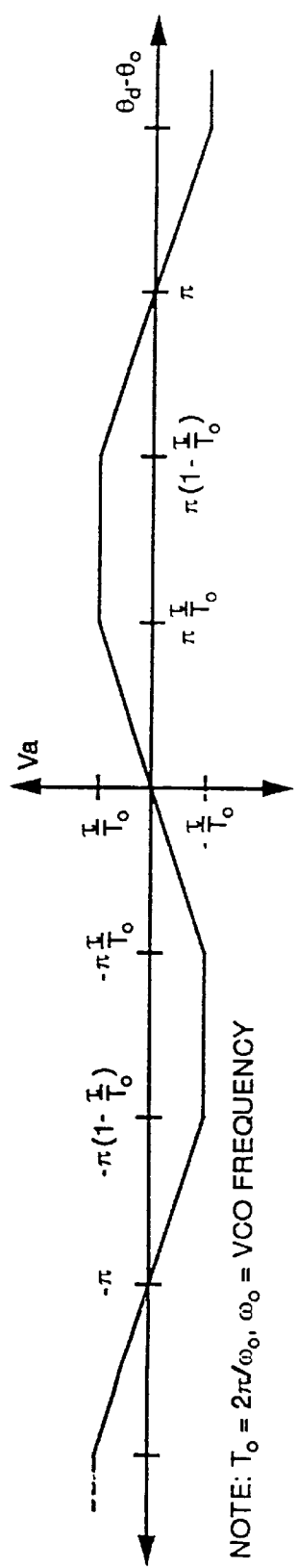
FIG. 9 is a graphical representation of the output of the phase detector of FIG. 7 versus phase error.

A plot of average value of the ternary output versus phase error is given in FIG. 9. Note that positive phase error is defined as the input data stream transitions leading the zero phase error position on the VCO clock (as shown in FIG. 8). Negative phase error is defined as input data stream transitions lagging the zero phase error position. The linear region occurs between $-\pi\tau/T_o$ and $\pi\tau/T_o$ and the phase detector gain $K_{pd}$ is $1/\pi$. Note also that the maximum value of $\tau$ is $T_o/2$, giving a maximum phase error of $\pi/2$.

Figure 10:
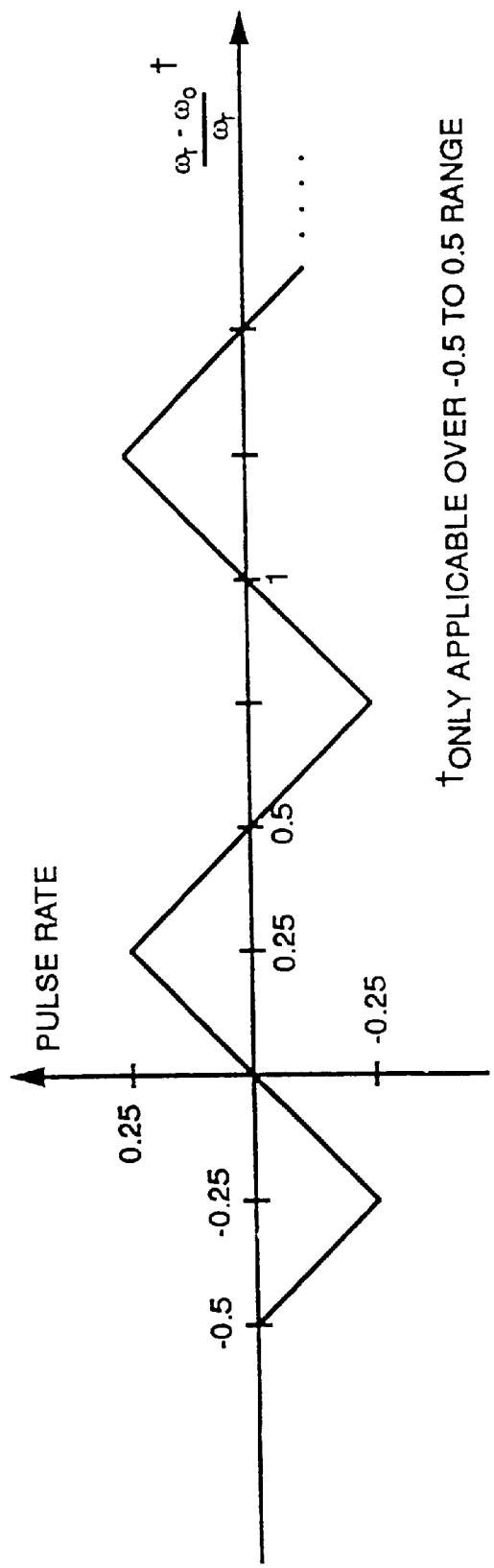
FIG. 10 is a graphical representation of the characteristic of a rotational frequency detector used in the application of the SFPLL to timing recovery from a NRZ data stream.

The frequency detector used is described by D.G. Messerschmitt in "Frequency Detectors for PLL Acquisition in Timing and Carrier Recovery," IEEE Transactions on Communications, Vol. COM-27, No. 9, September 1979, p. 1288 and is called a rotational frequency detector. It is implemented using purely digital components such as flip flops and logic gates. The paper written by Messerschmitt should be consulted for a description of operation. The rotational frequency detector outputs a positive or negative pulse every time the reference clock ($\omega'_r$) phase 'slips' past the VCO clock ($\omega'_o$). The rate at which the detector outputs pulses indicates the magnitude of the frequency difference $\omega'_r-\omega'_o$. The rotational frequency detector characteristic is shown in FIG. 10. The output pulse rate has a maximum of one pulse every four VCO clock cycles. The rotational frequency detector characteristic is linear over the range $|\omega'_r-\omega'_o|\leq\omega'_r/4$, and has a useable range of $|\omega'_r-\omega'_o|\leq\omega'_r/2$. The gain of the rotational frequency detector, $K_{fd}$ is $1/\omega'_r$.

The output of the rotational frequency detector is in pulse rate form, so it needs to be averaged over a number of $\omega'_o$ cycles before being interpreted. For increased precision in the measurement of $\omega'_r-\omega'_o$, the number of $\omega'_o$ cycles over which the frequency detector output is averaged must be increased. Hence an instantaneous measurement of frequency difference is not available, rather time is required for averaging. The rotational frequency detector measures frequency difference indirectly by observing phase slips of one $\omega'_o$ cycle. So for short term frequency variations that cause less than the one $\omega'_o$ cycle phase slip, the rotational frequency detector will not respond. The rotational frequency detector does provide measurements of arbitrary precision, as all phase slips of one $\omega'_o$ cycle are counted. However, it takes a large number of reference clock cycles to average the output for high precision.

System Overview

Generic requirements for a NRZ data timing recovery system include:
(1) Very narrow system bandwidth.
(2) Range of frequencies that the timing recovery system can lock to is confined close to the nominal data rate.
(3) Output clock at nominal data rate when input data stream is not present.

A SFPLL with a filter $F_c(s)$ (component 18 FIG. 1) that has a pole at the origin best meets these generic requirements. Hence the SFPLL with $F_c(s)$ containing a pole at the origin will be used for the timing recovery system. A major goal of the timing recovery system is to implement as much of it as possible in digital IC (Integrated Circuit) technology. Implementation in digital IC technology allows integration of the timing recovery system with higher layer functions. And since digital IC technology tends to progress quicker and is more readily available than analog IC technology, the timing recovery system can operate at higher speeds and be made cheaply.

Figure 11:
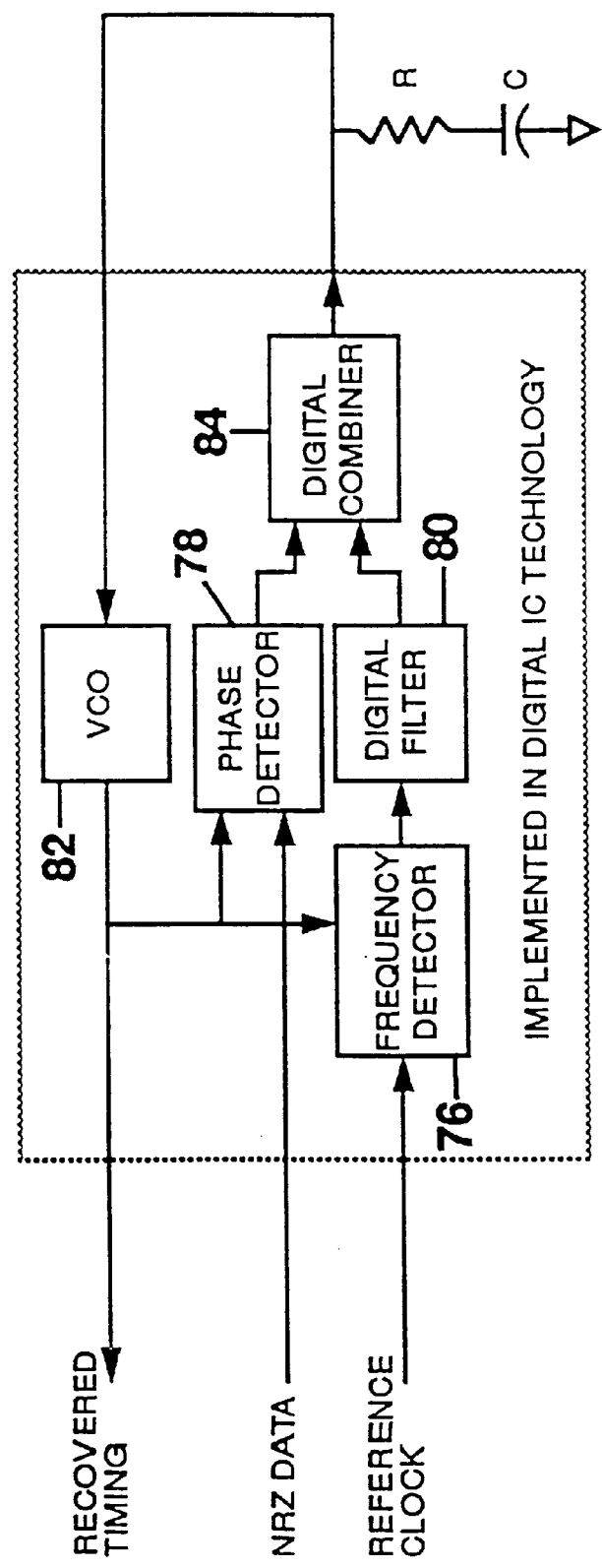
FIG. 11 is a functional block schematic circuit diagram of the timing recovery system.
Figure 12:
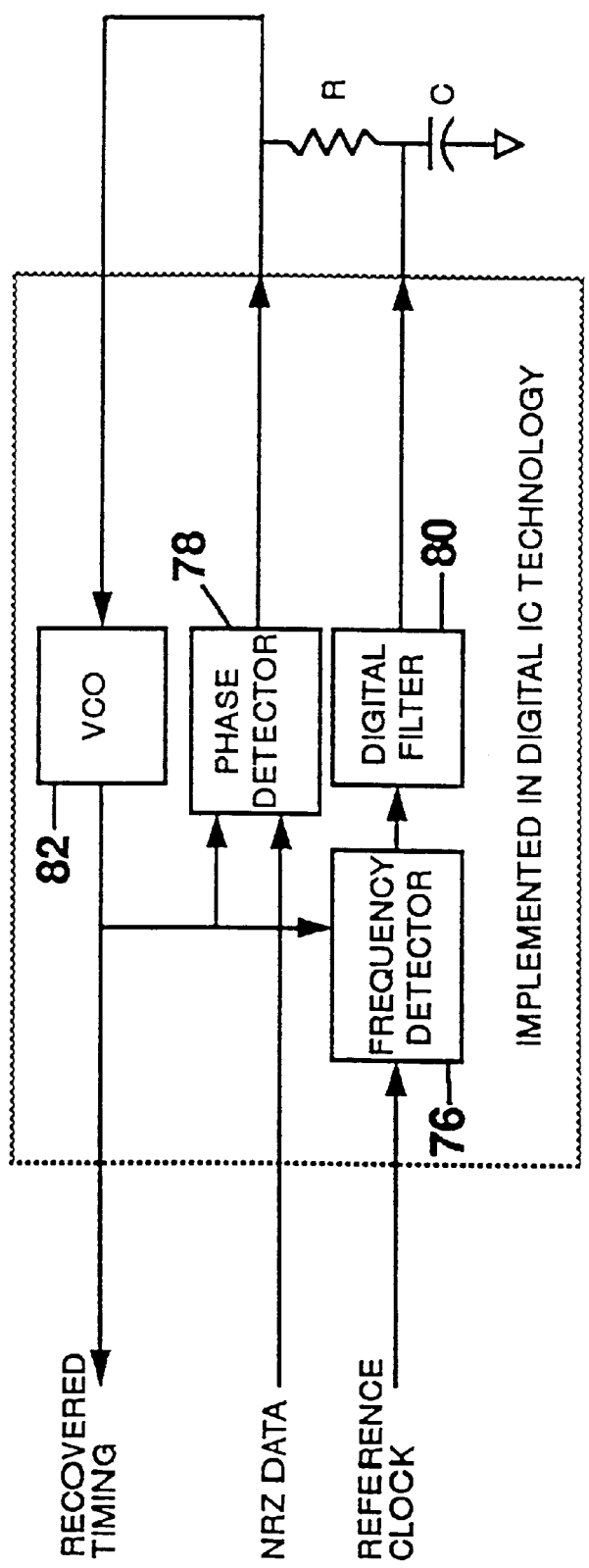
FIG. 12 is a functional block schematic circuit diagram of a variant of the timing recovery system.

A block diagram of one form of the timing recovery system is shown in FIG. 11. A variant with slightly better characteristics is shown in FIG. 12. The system of FIG. 11 comprises a frequency detector 76, a phase detector 78, a digital filter 80, a voltage controlled oscillator (VCO) 82 and a digital combiner 84. The system of FIG. 12 is similar but does not employ a digital combiner. The outputs of the digital circuits to the analog components: R and C, are ternary current pulses of possible values +I, 0, -I amps. The widths of the current pulses are continuously variable. The analog output back to the VCO 82, is a voltage referenced to ground.

Two very similar timing recovery systems are discussed in this section:

(1) The first, as shown in FIG. 11, has the phase and frequency detector outputs combined digitally before they are sent to the R and C. This timing recovery system requires only one output pin with a ternary current pump, since phase and frequency detector outputs are combined. In the rest of this example application this timing recovery system will be called 'the timing recovery system'.

(2) The second, as shown in FIG. 12, has the phase detector output going through the R to the C. But, the frequency detector output goes directly to the C. This configuration requires two output pins with ternary current pumps, but offers slightly better performance than the first timing recovery system. In the rest of this example application this timing recovery system will be called 'the timing recovery system variant'.

The components of FIG. 11 and FIG. 12 are now described and related back to the SFPLL definition shown in FIG. 1.

In the timing recovery system of FIG. 11 the phase detector 78 corresponds to the phase detector 10 in FIG. 1, and frequency detector 76 corresponds to the frequency detector 22 in FIG. 1. The digital filter 80 in FIG. 11 corresponds to the third filter component 26 in FIG. 1, and the resistor R and capacitor C implement the second filter component 18 in FIG. 1. The VCO 82 in FIG. 11 corresponds to the VCO 20 in FIG. 1, and the digital combiner 84 corresponds to the summer 16 in FIG. 1.

In the timing recovery system variant illustrated in FIG. 12 the phase detector 78 corresponds to the phase detector 10 in FIG. 1, and the frequency detector 76 corresponds to the frequency detector 22 in FIG. 1. The digital filter 80 in FIG. 12 corresponds to the third filter component 26 in FIG. 1, and the resistor R along with capacitor C implement the first filter component 14 in FIG. 1. Furthermore, in the system variant of FIG. 12 the capacitor C also implements the second filter component 18 in FIG. 1 and is the point where the frequency and phase loops are summed, corresponding to summer 16 in FIG. 1. The VCO 82 corresponds to the VCO 20 in FIG. 1.

The value of the resistor R and capacitor C analog components in the loop filter can be determined from system parameters, such as band width and dampening using basic PLL theory. The open loop crossover frequency of the phase loop, $\omega_c$ is approximately equal to the closed loop band width. The closed loop band width (and hence $\omega_c$) and the phase loop dampening factor: $\zeta_p$ will be determined by the phase jitter transfer characteristics specified in standards like Bellcore, TR-NWT-000253, "Synchronous Optical Network (SONET) Transport Systems: Common Generic Criteria," Issue2, December 1991.

The output from the phase detector is a current of maximum value $I_{pd}$ which when related to previous discussed SFPLL parameters, equals the gain $K_p$. Thus using basic PLL theory the values for the resistor and capacitor are:

$$C \approx \frac{4\alpha K_p K_{vco} \zeta_p^2}{\pi \omega_c^2} \quad (20)$$

$$R \approx \frac{\pi \omega_c}{\alpha K_p K_{vco}} \quad (21)$$

An extra gain factor a is used to take into account the fact that in an NRZ data stream a data transition does not generally occur every clock cycle. Over a period of time there will be an average number of clock cycles per data transition. $\alpha$ is defined as the inverse of this average number of clock cycles per data transition. As such $\alpha$ is always less than or equal to one.

A confinement factor $\beta$ is defined by:

$$\beta = \frac{\omega_r'}{\omega_m - \omega_r'} \quad (22)$$

where $\omega'_r$ is the reference frequency and $\omega_m$ is the frequency furthest from $\omega'_r$ to which the phase loop is to be allowed to lock.

The output of the frequency detector is a current of maximum value $I'_{fd}$ which when related to previously discussed SFPLL parameters, equals the gain $K_f$. Relating to $K_f$ to previously defined parameters, $$I'_{fd} = K_f = \frac{\alpha \beta}{2} K_p \quad (23)$$

When the frequency detector pumps current into the capacitor C it causes phase and frequency disturbances to the phase loop. If these disturbances are too great they will cause the phase loop to loose lock. There are two disturbance mechanisms:

The first disturbance is a phase disturbance. It is caused when the frequency detector pumps current through resistor R, thus causing a short term shift in the VCC voltage and hence a phase jump. The timing recovery system variant does not suffer from this disturbance as it bypasses resistor R, pumping instead directly into the capacitor C. This phase disturbance is denoted $\theta_d$.

The second disturbance is a frequency disturbance. It is caused by the voltage on capacitor C being shifted as a result of current being pumped into C. Hence the VCO has a shifted voltage applied to it. The phase loop will eventually counter act this through its phase error, $\theta_e$, as long as the phase loop remains locked. This disturbance is common to both the timing recovery system and timing recovery system variant. This frequency disturbance is denoted $\omega_d$.

Considering now the situation where the reference clock input is not $(\omega'_r$, but instead is a sub-multiple, i.e. the frequency has been divided by an integer m. This situation will likely be the norm as the range of frequencies at which low cost crystal oscillators (which will most likely provide $\omega'_r$) operate is limited to a few tens of megahertz. With $\omega'_r$ now a sub-multiple m, the rate at which the frequency detector emits pulses is reduced by a factor of m. To maintain the same frequency loop gain the duration of the frequency detector current pulse width must be increased m times, or the current $I'_{fd}$ increased m times. Either way the disturbance to the phase loop is increased m times, even though it will occur m times less often.

Figure 13:
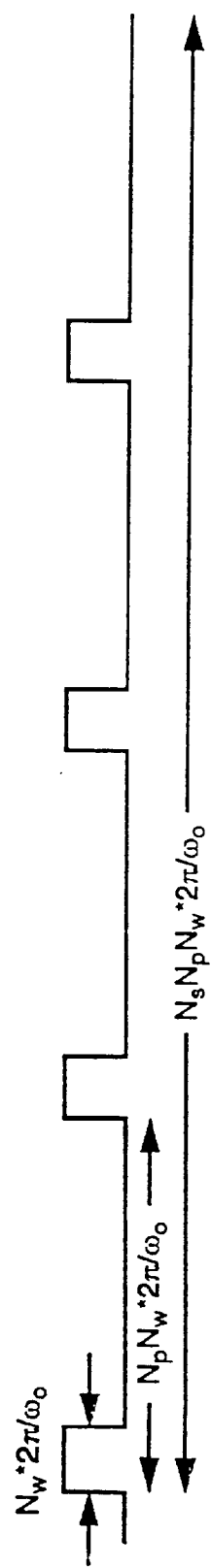
FIG. 13 illustrates how a pulse from the frequency detector of FIG. 10 can be broken up into a large number of smaller pulses.

One method of reducing the sudden phase and frequency disturbance of each pulse from the frequency detector would be to spread the pulse out over a long time. This could be done by breaking the pulse up into a large number of smaller pulses as shown in FIG. 13. Each frequency detector pulse is broken up into $N_s$ smaller pulses, each of $N_w$ VCO clock periods wide, and spaced at $N_p N_w$ VCO clock periods. Thus $I'_{fd}$ is reduced, effectively decoupling it from $K_f$. The new frequency loop output current $I_{fd}$ is defined:

$$I_{fd} = I'_{fd} \frac{m}{N_w N_s} \tag{24}$$

Having $I_{fd}$ now decoupled from $K_f$ provides some freedom in choosing $I_{fd}$. The frequency loop only has to nullify the phase loop output (in this case current is output) to steer and confine the VCO (as $F_c(s)$ has a pole at the origin) and hence $\omega'_o$ to whatever value it likes. For the particular phase detector employed, the maximum average output current $I_{mxapd}$ is:

$$I_{mxapd} = \frac{\alpha K_p}{2} = \frac{\alpha I_{pd}}{2} \tag{25}$$

Hence require:

$$I_{fd} > \frac{\alpha I_{pd}}{2} \tag{26}$$

Fast steering of the VCO is what is sacrificed by making Ifd small. But apart from system power up, when capacitor C is discharged and the VCO input is zero, the VCO is always very close to the steady state value of $\omega'_o$. So fast steering (and a large $I_{fd}$) is not really required. Choosing:

$$I_{fd} = I_{pd} \tag{27}$$

satisfies equation (26) and allows the frequency detector and phase detector outputs to be combined digitally, and only one ternary current pump is required. Even with the timing recovery system variant, where individual current pumps are used for phase and frequency detectors, using the same current pump for both could reduce design costs.

The digital filter system (component 80 FIGS. 11 and 12) performs the pulse spreading scheme which reduces the phase and frequency disturbances mentioned above. Also it introduces a pole at frequency $\omega_p$ in the open loop frequency response of the frequency loop. In operation the frequency loop (which includes the digital filter) needs to be stable. Closed loop stability in this case can be specified by a frequency loop damping factor $\zeta_f$. With a sufficiently high $\zeta_f$ the frequency loop will be stable. $\omega_p$ can be determined in terms of $\zeta_f$ and other system parameters:

$$\omega_p = \frac{\pi \beta \zeta_f^2 \omega_c^2}{2 \zeta_p^2 \omega'_r} \tag{28}$$

The digital filter was constructed using 'Operational digital' techniques which employ Binary Rate Multipliers (BRM) (see M. A. Meyer, "Digital Techniques in Analog Systems," IRE Transactions—Electronic Computers, EC-3 (June 1954), pp. 23–29. for a description of these concepts.)

BRMs take an n bit binary number, B (between 0 and $2^n-1$), and produce an output pulse stream which has a ratio of ones to zeros given by:

$$\frac{B}{2^n} \tag{29}$$

n is related to $N_p$:

$$N_p = 2^n \tag{30}$$

A single pole system with input u(t), and output y(t) is described by the following differential equation $$dy = \omega_p u(t) dt - \omega_p y(t)\, dt \tag{31}$$

Figure 14:
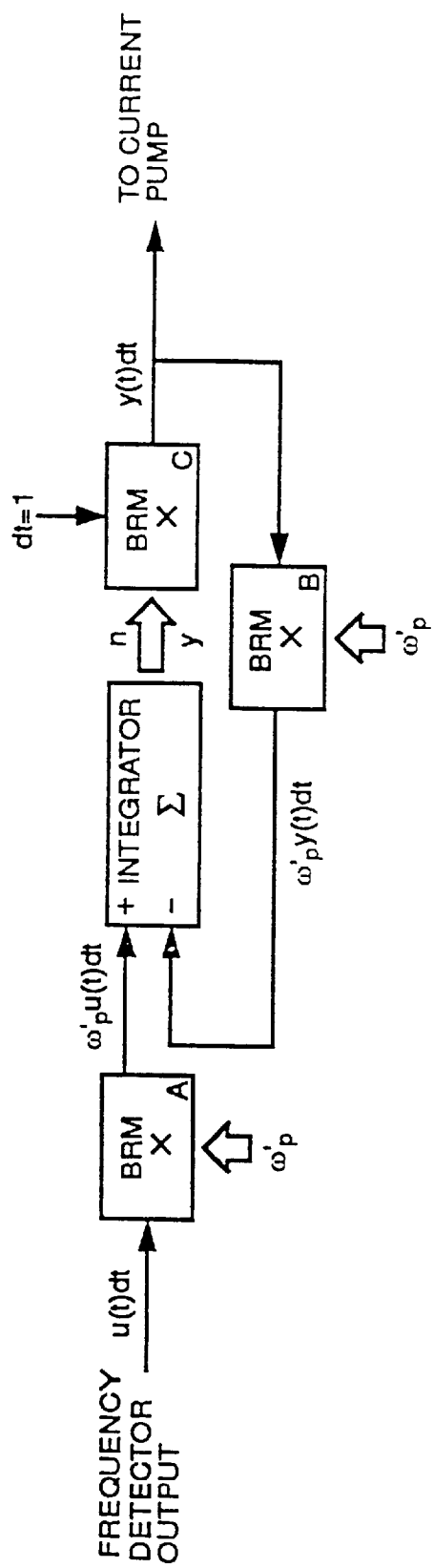
FIG. 14 is a functional block schematic circuit diagram of a Binary Rate Multiplier (BRM) based digital filter.

A system of integrators and BRMS that implements the above equation is shown in FIG. 14.

The BRM based system runs off a clock of period $N_w 2\pi/\omega'_o$. The integrator block accumulates the n bit value y(t), which is then fed into a BRM to produce the output pulse stream. The integrator block is implemented with an up down counter. The pulse stream from the frequency detector forms the input u(t)dt. The fractional multiplier $\omega'_p$ is assigned a value so that the BRM based system has an identical time response as the system described in equation (31).

$\omega'_p$ is determined as follows. For the continuous time system, from equation (31), in time dt seconds y(t) is reduced by $$\omega_p y(t) dt \tag{32}$$

In the BRM system, y(t) is reduced by $\omega'_p y(t)$ when $\omega'_p y(t)$ pulses leave BRM B. For $\omega'_p y(t)$ pulses to leave BRM B requires y(t) pulses to be input to BRM B. To input y(t) pulses requires $2^n$ clocks (n is the length of BRM C), which is a time of $2^n N_w 2\pi/\omega'_o$ seconds.

In the BRM system dt seconds corresponds to dt/$(2^n N_w 2\pi/\omega'_o)$ cycles of BRM C and hence in dt seconds y(t) is reduced by $$\omega'_p y(t) \frac{dt}{2^n N_w 2 \frac{\pi}{\omega_o}} \tag{33}$$

Equating (32) and (33) and substituting in (30) we obtain $$\omega'_p = \omega_p N_p N_w 2 \frac{\pi}{\omega'_o} \tag{34}$$

The output of the frequency detector is in pulse rate form and is fed directly into the system as u(t)dt. Every increment in y(t) produces $1/\omega'_p$ pulses at the system output, before that increment in y(t) is nullified by a pulse at the negative input of the integrator block. To produce an increment in y(t) requires $1/\omega'_p$ pulses from the frequency detector. The pulse spreading scheme requires that $N_s$ pulses be generated from every frequency detector pulse though. $N_s$ pulses from every frequency detector pulse can be achieved by either multiplying the input pulse rate by $N_s$. Or simply changing the fractional multiplier of BRM A $\omega'_p$ to $\omega'_p N_s$ i.e. don't divide by so much. The latter is the more preferable method, as no extra hardware is required. Though because the new fractional multiplier must be less than or equal to one, a new constraint is created:

$$\omega'_p N_s \leq 1 \quad (35)$$

From (34) and (35) the following relating $N_p$ to other system parameters is obtained $$N_p \leq \frac{\omega'_o}{2\pi N_s N_w \omega_p} \quad (36)$$

If $$\omega'_p N_s = 1 \quad (37)$$

then BRM A is eliminated and the frequency detector output is fed directly into the integrator.

Implementation Details for Sonet STS-3c Timing Recovery

The above sections have shown that it is possible to implement an SFPLL system to perform timing recovery almost entirely out of digital components.

Figure 15:
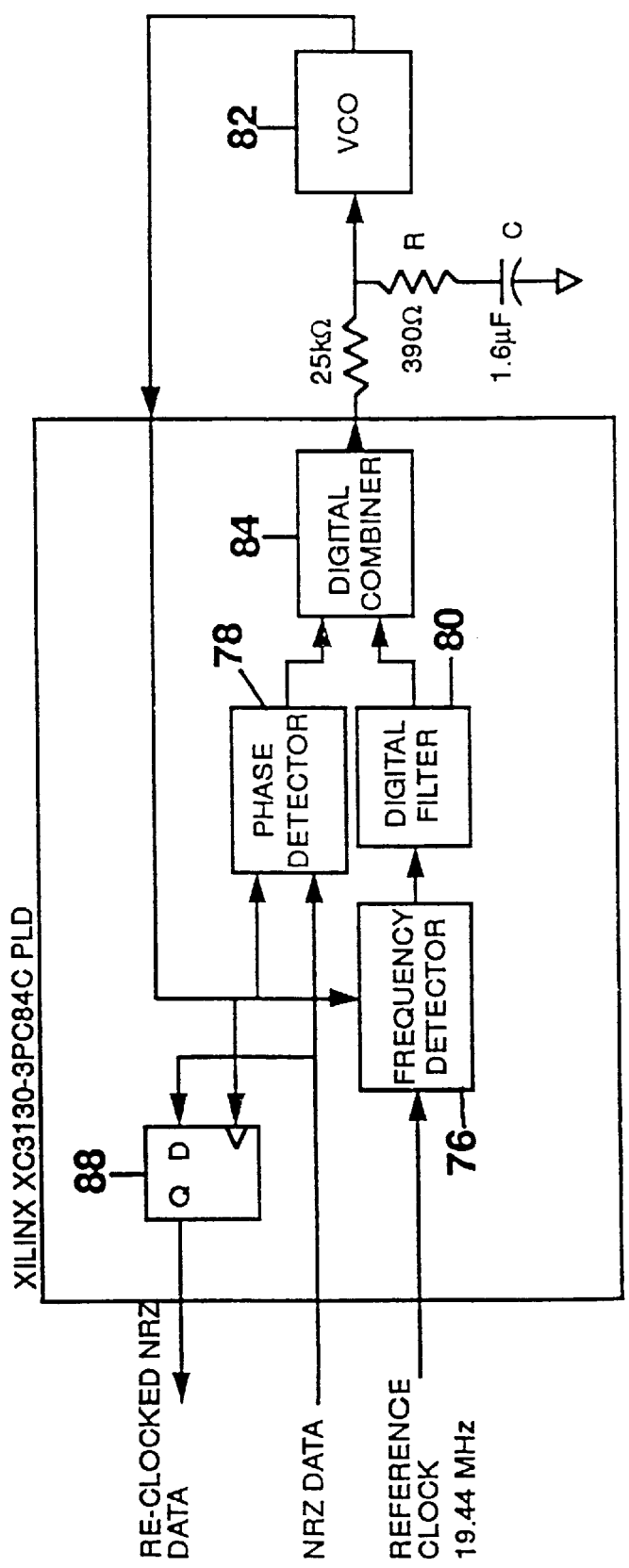
FIG. 15 illustrates one example of a practical implementation of the circuit of FIG. 11; and, FIG. 16 illustrates a simplified digital filter used in the practical implementation of FIG. 15.

A working prototype of a SFPLL based timing recovery system employing the theory developed in the above sections is shown in FIG. 15.

Figure 16:
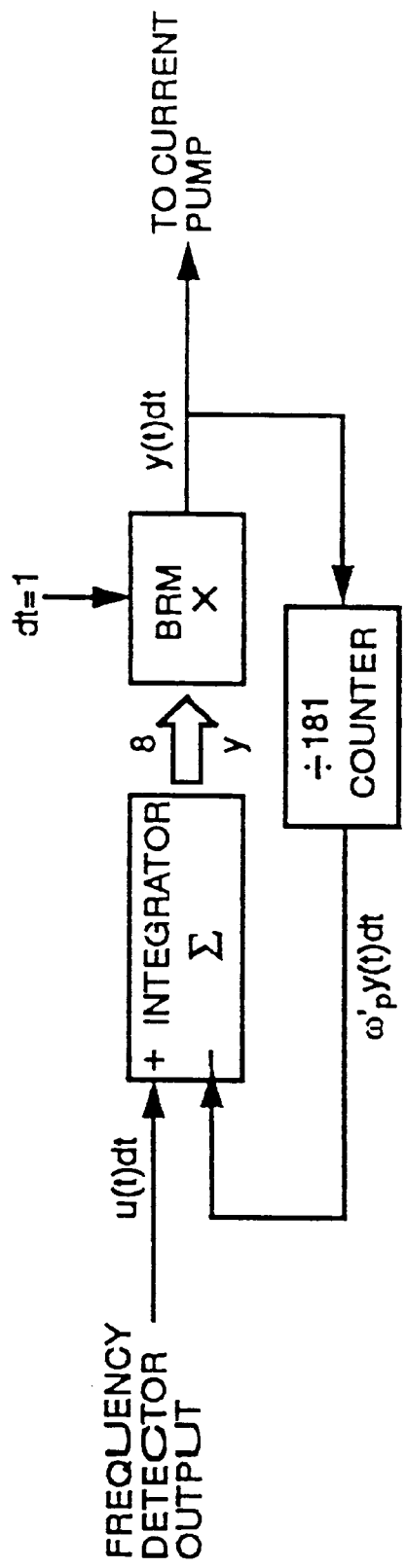

Components 76 through to 84 of FIG. 15 correspond to components 76 through to 84 of FIG. 11. The D type flip flop 84 re-clocks the NRZ data input with the recovered timing. Components 76, 78, 80, 84 and 88 are all implemented in a Xilinx XC3130-3PC84C programmable logic device (PLD). To implement a ternary current pump the digital combiner output used a tristate buffer. The output of this tristate buffer is connected to a 25kΩ resistor. The ternary current pump works as follows: When no current needs to be pumped, the tristate buffer is left in the tristate condition, and no current flows. When positive current needs to be pumped the tristate buffer is turned on to a '1', which makes the buffer output 5 volts. A voltage difference is developed across the 25kΩ resistor and current flows into the R and C filter. The voltage on the VCO 82 is assumed to be around 2.5 volts, so the amount of current pumped is: (5−2.5)volts/25kΩ=100 μamps. Similarly when negative current needs to be pumped the tristate buffer is turned on to a '0', which makes the buffer output 0 volts, and −100 μamps flows through the 25kΩ resistor. Also, by a judicious choice of parameters, the digital filter implementation (80 in FIG. 15) is simplified to the implementation shown in FIG. 16.

Advantages of the SFPLL Tixning Recovery System

The SFPLL was applied to the problem of recovering timing from a NRZ data stream. The SFPLL based timing recovery system described employed predominately digital integrated circuit technology. Very accurate steering and confinement of the SFPLL based timing recovery system is possible due to the following reasons:
(1) Use of an accurate reference clock.
(2) Use of a precise digital frequency detector.
(3) The above two components are coupled together in a feedback loop.

The accurate output clock when no data input is present and accurate confinement are characteristics associated with expensive VCXO (Voltage Controlled Crystal Oscillator) based timing recovery systems. The SFPLL based timing recovery system provides VCXO features at much lower cost. In addition it allows the phase loop bandwidth and range of frequencies to which the system will lock to be set freely. VCXO based timing recovery systems generally have very low bandwidth and a very limited range of frequencies to which they will lock.

The SFPLL based timing recovery system has the following features:

1. The basic implementation introduces some jitter into the recovered timing. Though this jitter can be made small (especially for the timing recovery system variant) in comparison to other sources of jitter. The introduced jitter is due to the discrete nature of the digital frequency detector used.
2. A static phase error will be present, though for typical applications the phase error will be very small.
3. The spectral characteristics of the output clock are not known when data is not present at the input, since the output clock is not phase locked.
4. Accuracy of the steering and confinement of the timing recovery system will be limited by leakage currents from the integrator, C. These leakage currents are due to the digital I/O pins and the integrator capacitor C. Through careful design and choice of components these leakage currents can be made insignificant.
5. The reference clock used by the SFPLL is only a reference and is not modified. Hence one reference clock source can be used by multiple SFPLLs in a system. Or the reference clock may be used in other components of the system in which the SFPLL is employed.
6. It is low cost and can operate at high speeds as it uses predominately digital IC technology.
7. There is the potential for integration with higher layer functions, such as serial to parallel conversion of the data stream.
8. The timing output when there is no data at the input is very close to the reference clock.
9. There is very rapid locking to an input data stream as the initial positioning of the VCO frequency is very close to the input data stream rate.
10. False locking onto data side-bands can be eliminated.
11. The phase loop bandwidth can be set independent of any pull-in range requirements.
12. Low cost VCOs with poorly specified centre frequencies can be used.

From the above description of the preferred embodiment of the SFPLL according to the invention together with several applications thereof, it will be apparent that the SFPLL has a number of advantages over conventional PLLS; including the following:

1. The SFPLL will phase lock to an input signal, as with a conventional Phase Locked Loop (PLL), but additionally the SFPLL will only lock to input signals whose frequency is in a range close to the frequency of the reference input. Through proper choice of SFPLL parameters the range of frequencies around the local reference frequency to which the SFPLL will lock can be made arbitrarily small.

The mechanism that confines the SFPLL to the desired range of frequencies around the reference frequency is continuously acting and does not require any monitoring nor any decision to be made. The mechanism that confines the SFPLL to the desired range of frequencies relies on the following. As the frequency of the VCO deviates from the reference frequency, a phase error is induced in the phase loop to counteract the effect of the frequency loop pulling the VCO frequency back to that of the reference.

2. When no input signal is present the output of the SFPLL has a frequency close to the reference input frequency. Whereas in a PLL the output frequency will be unspecified when there is no input signal.
3. The phase and frequency instabilities of the VCO used in the construction of a PLL can effect greatly the performance of the PLL. The SFPLL structure on the other hand reduces the effect of these phase and frequency instabilities (named phase noise) greatly, allowing much better performance using an identical VCO than would be possible with a PLL.
4. The major components which constitute the SFPLL, in particular the frequency loop components, can be implemented in digital technology. This implementation in digital technology was demonstrated in the example application to timing recovery for NRZ data streams. The implementation in digital technology is highly advantageous as it permits extremely accurate and controllable positioning of the range of frequencies to which the SFPLL can lock.

Now that a preferred enbodiment of the SFPLL and several applications have been described in detail, numerous variations and modifications will suggest themselves to persons skilled in the electronics arts, in addition to those already described, without departing from the basic inventive concepts. For example, there are many other applications where the SFPLL of the present invention may be usefully implemented. All such variations and modifications are to be considered within the scope of the present invention, the nature of which is to be determined from the foregoing description and the appended claims.

I claim:

1. A steered frequency phase locked loop (SFPLL) comprising:
    a phase loop having a first input signal and an output signal and which is adapted to lock the phase of the output signal to that of the input signal, wherein said phase loop includes a phase detector a first signal filtering means coupled to the output of said phase detector for filtering the output signal from said phase detector and a voltage controlled oscillator operatively coupled to an output of said phase detector, an output of said voltage controlled oscillator being connected to an input of said phase detector to complete the phase loop;
    a frequency loop operatively coupled to the phase loop and having a second input signal providing a reference frequency, wherein said frequency loop includes a frequency detector and a second signal filtering means coupled to an output of said frequency detector for filtering the output signal of said frequency detector, the output of said voltage controlled oscillator is connected to an input of said frequency detector to complete the frequency loop;
    means for summing the respective output signals of said phase detector and said frequency detector and supplying the sum to said voltage controlled oscillator; and
    a third signal filtering means connected between said summing means and said voltage controlled oscillator;
    wherein said reference frequency competes at all times with said first input signal for control of said voltage controlled oscillator, and wherein said frequency loop uses said reference frequency to dynamically steer said phase loop and effectively confines the range of frequencies to which said phase loop can lock close to said reference frequency.

2. A steered frequency phase locked loop as defined in claim 1, wherein said phase loop and frequency loop further comprise first and second gain components respectively.

3. A steered frequency phase locked loop as defined in claim 2, wherein said frequency loop further comprises a second summing means for adding a constant offset signal into the frequency loop wherein the reference frequency can be offset to an apparent reference frequency whereby, in use, the SFPLL can be centred on any selected reference frequency simply by changing the value of the offset signal.

4. A steered frequency phase locked loop as defined in claim 2, further comprising a variable phase shifter for shifting the phase of the output signal so as to correct any phase error induced by the SFPLL.

5. A steered frequency phase locked loop as defined in claim 1, adapted so as to provide demodulation in continuous wave (CW) modulation systems, the phase detector of the SFPLL having an RF input signal with a limited range of frequencies which contain a number of radio channels, and wherein the SFPLL is adapted to filter out and demodulate a particular input radio channel selected by adjusting the reference frequency.

6. A steered frequency phase locked loop as defined in claim 1, adapted so as to provide a system for timing recovery from a data stream.

7. A steered frequency phase locked loop as defined in claim 6, wherein said timing recovery system is implemented using a digital integrated circuit, said third filtering means comprising a digital filter and said first filtering means comprising a resistor/capacitor combination.

8. A steered frequency phase locked loop as defined in claim 7 wherein said phase detector for the timing recovery system is implemented using an edge to pulse converter which receives an input data stream and generates a pulse of width τ when a transition occurs, in the input data stream, said pulse being ANDed in two AND gates with an output signal from the voltage controlled oscillator (VCO) and with the inverse of the VCO output signal respectively.

9. A steered frequency phase locked loop as defined in claim 8, wherein the outputs of said two AND gates is summed to form a ternary output, the actual phase error being determined by taking an average value of said ternary output.

10. A steered frequency phase locked loop as defined in claim 7, wherein said frequency detector for the timing recovery system is implemented using a rotational frequency detector which generates an output pulse every time the phase of the reference frequency signal slips past the output signal from the voltage controlled oscillator, wherein the rate at which the frequency detector outputs pulses indicates the magnitude of the frequency difference.

11. A steered frequency phase locked loop as defined in claim 7, wherein said digital filter is implemented using Binary Rate Multipliers (BRMs) and an integrator to perform a pulse spreading function whereby phase and frequency disturbances in the phase loop can be reduced.

12. A steered frequency phase locked loop (SFPLL) comprising:
    (a) a first SFPLL, including
        (i) a phase loop having a first input signal and an output signal and which is adapted to lock the phase of the output signal to that of the input signal, wherein said phase loop includes a phase detector, a first signal filtering means coupled to the output of said phase detector for filtering the output signal from said phase detector and a voltage controlled oscillator operatively coupled to an output of said phase detector, an output of said voltage controlled oscillator being connected to an input of said phase detector to complete the phase loop;

(ii) a frequency loop operatively coupled to the phase loop and having a second input signal providing a reference frequency, wherein said frequency loop includes a frequency detector and a second signal filtering means coupled to an output of said frequency detector for filtering the output signal of said frequency detector, the output of said voltage controlled oscillator is connected to an input of said frequency detector to complete the frequency loop;

(iii) means for summing the respective output signals of said phase detector and said frequency detector and supplying the sum to said voltage controlled oscillator, wherein said reference frequency competes with the first input signal for control of the voltage controlled oscillator; and (iv) a third signal filtering means connected between said summing means and said voltage controlled oscillator, wherein the frequency loop uses the reference frequency to dynamically steer the phase loop and effectively confines the range of frequencies to which the phase loop can lock close to the reference frequency; and (b) a second SFPLL connected in cascade with said first SFPLL, said second SFPLL being arranged and configured in the same configuration as said first SFPLL, and wherein the output signal of said first SFPLL provides the reference frequency for said second SFPLL whereby, in use, the output of said second SFPLL has zero phase and frequency error.

* * * * *